(12) United States Patent
Kimura

(10) Patent No.: US 11,374,091 B2
(45) Date of Patent: Jun. 28, 2022

(54) SEMICONDUCTOR DEVICE

(71) Applicant: Mitsubishi Electric Corporation, Tokyo (JP)

(72) Inventor: Kota Kimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/266,244

(22) PCT Filed: Dec. 19, 2018

(86) PCT No.: PCT/JP2018/046801
§ 371 (c)(1),
(2) Date: Feb. 5, 2021

(87) PCT Pub. No.: WO2020/129186
PCT Pub. Date: Jun. 25, 2020

(65) Prior Publication Data
US 2021/0296444 A1 Sep. 23, 2021

(51) Int. Cl.
*H01L 29/06* (2006.01)
*H01L 29/417* (2006.01)
*H01L 29/45* (2006.01)
*H01L 29/739* (2006.01)

(52) U.S. Cl.
CPC .... *H01L 29/0696* (2013.01); *H01L 29/41708* (2013.01); *H01L 29/456* (2013.01); *H01L 29/7397* (2013.01)

(58) Field of Classification Search
CPC ........... H01L 29/0696; H01L 29/41708; H01L 29/456; H01L 29/7397
USPC ...................................................... 257/140
See application file for complete search history.

(56) References Cited

U.S. PATENT DOCUMENTS

| 2008/0048295 A1 | 2/2008 | Takahashi |
| 2013/0001639 A1 | 1/2013 | Iwasaki et al. |
| 2013/0181254 A1 | 7/2013 | Iwasaki |

(Continued)

FOREIGN PATENT DOCUMENTS

| JP | 2008-053648 A | 3/2008 |
| JP | 2013-145851 A | 7/2013 |
| WO | 2011/125156 A1 | 10/2011 |

OTHER PUBLICATIONS

International Search Report; Written Opinion; and Notification of Transmittal of The International Search Report and the Written Opinion of the International Searching Authority, or the Declaration issued in PCT/JP2018/046801; dated Mar. 19, 2019.

*Primary Examiner* — Igwe U Anya
(74) *Attorney, Agent, or Firm* — Studebaker & Brackett PC

(57) ABSTRACT

A semiconductor device according to the present invention includes a substrate having an IGBT region, a diode region, and a high resistance region between the IGBT region and the diode region, a first electrode provided on an upper surface of the substrate and a second electrode provided on a back surface as a surface on an opposite side to the upper surface of the substrate, wherein in the high resistance region, a contact resistance between the upper surface of the substrate and the first electrode or a contact resistance between the back surface of the substrate and the second electrode is higher than in the diode region, and a width of the high resistance region is equal to or greater than a thickness of the substrate.

10 Claims, 9 Drawing Sheets

(56) References Cited

U.S. PATENT DOCUMENTS

2019/0326425 A1\* 10/2019 Bayruns .............. H01L 29/7784
2020/0098747 A1\* 3/2020 Tamura ................ H01L 29/868

\* cited by examiner

SEMICONDUCTOR DEVICE

FIELD

The present invention relates to a semiconductor device.

BACKGROUND

PTL 1 discloses an RC-IGBT (reverse-conducting-insulated gate bipolar transistor). In a semiconductor device in PTL 1, an emitter layer is provided in a region A on a first main surface side of a semiconductor substrate, but an emitter layer is not provided in a region B. Further, a collector P layer is provided in the region A on a second main surface side of the semiconductor substrate, and a cathode N layer is provided in the region B. That is, an IGBT is configured in the region A, and a diode is configured in the region B.

CITATION LIST

Patent Literature

[PTL 1] JP 2008-53648 A

SUMMARY

Technical Problem

In an RC-IGBT, in a case where a diode operates when a gate voltage of an IGBT is 0 V, electrons injected from an n-type cathode region into an n-type drift layer flow into a p-type anode layer. In addition, holes are injected from the p-type anode layer, and conductivity modulation thereby occurs. Accordingly, lowering of resistance is realized.

Meanwhile, in a case where the diode operates in a state where the gate voltage is applied to the IGBT, snapback may occur. Around a boundary between the IGBT and the diode, a state where the n-type cathode region of the diode and an n-type emitter region of the IGBT are short-circuited may occur due to an n-type inversion layer formed in the IGBT. As a result, electrons injected from an n-type cathode layer into the n-type drift layer pass through the n-type emitter region via the n-type inversion layer of the IGBT and go out into an emitter electrode. Accordingly, snapback occurs until a voltage drop due to movement of electrons exceeds a built-in voltage of p-n junction of the p-type anode layer and the n-type drift layer, and conductivity modulation of the diode does not occur. Consequently, a forward voltage drop of the diode becomes large, and loss increases in the RC-IGBT.

The present invention has been made to solve the above-described problem, and an object thereof is to obtain a semiconductor device that can prevent snapback.

Solution to Problem

A semiconductor device according to the invention of the present application includes a substrate having an IGBT region, a diode region, and a high resistance region between the IGBT region and the diode region, a first electrode provided on an upper surface of the substrate and a second electrode provided on a back surface as a surface on an opposite side to the upper surface of the substrate, wherein in the high resistance region, a contact resistance between the upper surface of the substrate and the first electrode or a contact resistance between the back surface of the substrate and the second electrode is higher than in the diode region, and a width of the high resistance region is equal to or greater than a thickness of the substrate.

A semiconductor device according to the invention of the present application includes a substrate having an IGBT region, a diode region, and a high resistance region between the IGBT region and the diode region, a first electrode provided on an upper surface of the substrate, and a second electrode provided on a back surface as a surface on an opposite side to the upper surface of the substrate, wherein in the diode region, the substrate has a cathode layer on the back surface side, in the high resistance region, the substrate has, on the back surface side, an n-type diffusion layer whose impurity concentration is equal to an impurity concentration of the cathode layer, among portions of the second electrode, a portion contacting with the cathode layer and a portion contacting with the n-type diffusion layer are formed of different materials, and a contact resistance between the n-type diffusion layer and the second electrode is higher than a contact resistance between the cathode layer and the second electrode.

A semiconductor device according to the present invention includes a substrate having an IGBT region, a diode region, and a high resistance region between the IGBT region and the diode region, a first electrode provided on an upper surface of the substrate, and a second electrode provided on a back surface as a surface on an opposite side to the upper surface of the substrate, wherein in the IGBT region, the substrate has a base layer on the upper surface side, in the diode region, the substrate has an anode layer on the upper surface side, in the high resistance region, the substrate has a p-type diffusion layer on the upper surface side, impurity concentrations of the anode layer and the p-type diffusion layer are lower than an impurity concentration of the base layer, the first electrode has barrier metal contacting with the upper surface of the substrate in the IGBT region and the high resistance region and a top electrode provided on the barrier metal and contacting with the upper surface of the substrate in the diode region, and a contact resistance between the p-type diffusion layer and the barrier metal is higher than a contact resistance between the anode layer and the top electrode.

Advantageous Effects of Invention

A semiconductor device according to the invention of this application can prevent electrons from flowing from a diode region to an IGBT region by a high resistance region. Consequently, snapback can be prevented.

DESCRIPTION OF EMBODIMENTS

Figure 1:
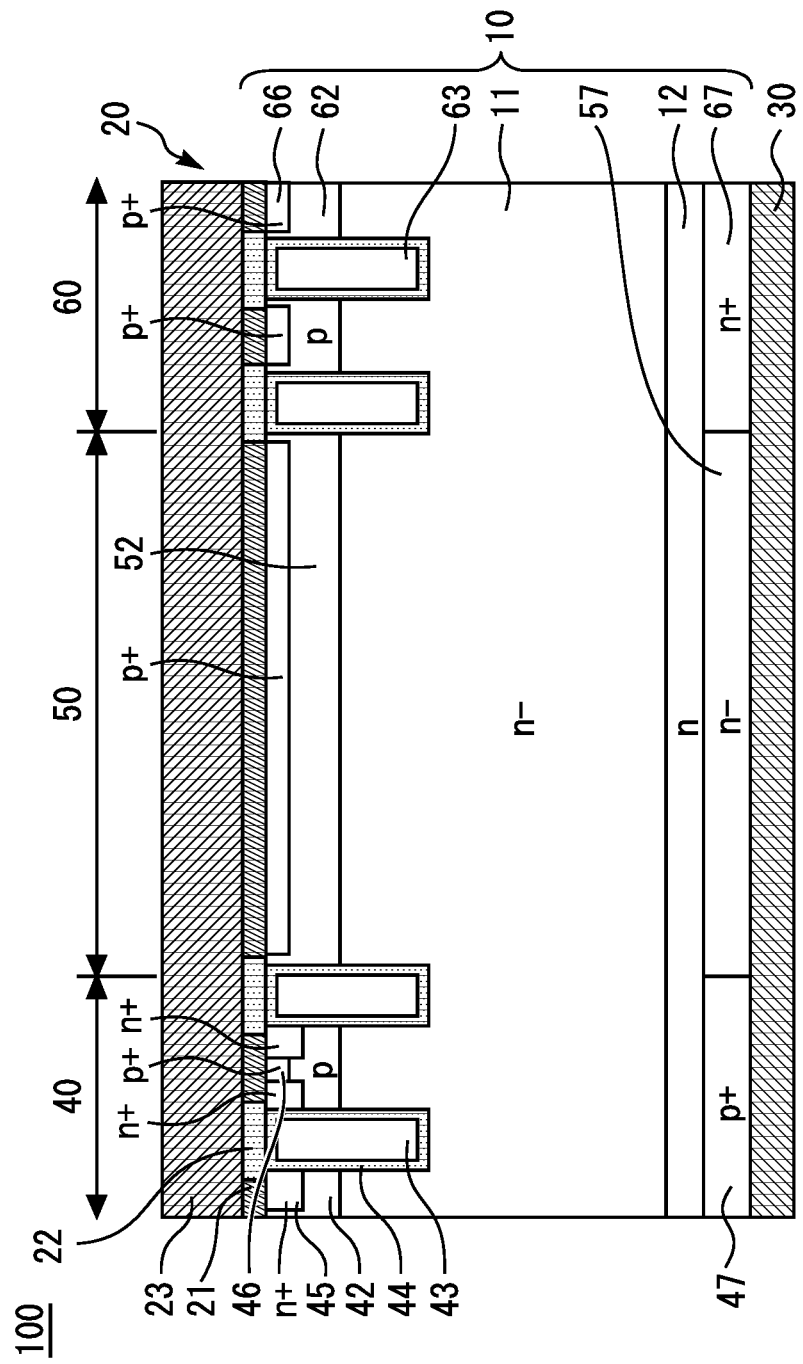
FIG. 1 is a cross-sectional view of a semiconductor device according to a first embodiment.

Semiconductor devices according to embodiments of the present invention are described with reference to drawings. Identical or corresponding constitutional elements are given the same reference numerals, and the repeated description of such constitutional elements may be omitted.

First Embodiment

FIG. 1 is a cross-sectional view of a semiconductor device 100 according to a first embodiment. The semiconductor device 100 is an insulated gate bipolar transistor in which a freewheeling diode is built. The semiconductor device 100 includes a substrate 10, a first electrode 20 provided on an upper surface of the substrate 10, and a second electrode 30 provided on a back surface as a surface on the opposite side to the upper surface of the substrate 10. The substrate 10 has an IGBT region 40, a diode region 60, and a high resistance region 50 between the IGBT region 40 and the diode region 60.

The substrate 10 has an n⁻ drift layer 11. An n buffer layer 12 is provided on the back surface side of the n⁻ drift layer 11. The n buffer layer 12 is formed over a whole surface of the substrate 10 so as to cover a p collector layer 47, an n-type diffusion layer 57, and an n⁺ cathode layer 67, which will be described later.

In the IGBT region 40, a p base diffusion layer 42 is provided on the upper surface side of the n⁻ drift layer 11. Gate electrodes 43 are provided in the IGBT region 40. The gate electrodes 43 extend from the upper surface of the substrate 10 to portions below a lower end of the p base diffusion layer 42. A gate oxide film 44 is provided around the gate electrode 43.

On the upper surface side of the substrate 10, n⁺ emitter diffusion layers 45 are provided. The n⁺ emitter diffusion layers 45 are formed shallower than the p base diffusion layer 42. In the IGBT region 40, the n⁺ emitter diffusion layers 45 are provided on both sides of the gate electrode 43. Further, on the upper surface side of the substrate 10, a p⁺ contact diffusion layer 46 is provided between the two n⁺ emitter diffusion layers 45. In the IGBT region 40, the p collector layer 47 is provided on the back surface side of the n buffer layer 12.

In the diode region 60, a p anode diffusion layer 62 is provided on the upper surface side of the n⁻ drift layer 11. Further, a p⁺ contact diffusion layer 66 is provided on the upper surface side of the substrate 10. The p⁺ contact diffusion layer 66 is formed shallower than the p anode diffusion layer 62. Gate electrodes 63 are provided in the diode region 60. The gate electrodes 63 extend from the upper surface of the substrate 10 to portions below a lower end of the p anode diffusion layer 62. A gate oxide film is provided around the gate electrode 63. Note that the gate electrodes 63 are short-circuited to an emitter and do not operate. In the diode region 60, the n⁺ cathode layer 67 is provided on the back surface side of the n buffer layer 12.

In the high resistance region 50, a structure on the upper surface side of the substrate 10 is the same as the diode region 60. In the high resistance region 50, the substrate 10 has a p-type diffusion layer 52 on the upper surface side. The impurity concentration and thickness are equal between the p anode diffusion layer 62 and the p-type diffusion layer 52. The p⁺ contact diffusion layer 66 may be provided on an upper surface of the high resistance region 50. In FIG. 1, the p⁺ contact diffusion layer 66 is arranged over a whole surface of the high resistance region 50. The arrangement is not limited to this, but the p⁺ contact diffusion layer 66 may be arranged in a portion of the upper surface of the high resistance region 50. In the high resistance region 50, the n-type diffusion layer 57 is provided on the back surface side of the n buffer layer 12. The impurity concentration of the n-type diffusion layer 57 is lower than the impurity concentration of the n⁺ cathode layer 67.

The first electrode 20 has barrier metal 21 contacting with the upper surface of the substrate 10 in the IGBT region 40, the diode region 60, and the high resistance region 50. The barrier metal 21 is provided to prevent mutual diffusion. Barrier metal is formed of Ti, for example. Further, interlayer films 22 are provided on the gate electrodes 43 and 63. The interlayer film 22 is formed of SiO2, for example. Further, a top electrode 23 is provided on the barrier metal 21 and the interlayer films 22. The top electrode 23 is an emitter electrode in the IGBT region 40 and is an anode electrode in the diode region 60. The top electrode 23 is formed of AlSi, for example. The top electrode 23 may be formed of Al.

The second electrode 30 is a collector electrode in the IGBT region 40 and is a cathode electrode in the diode region 60. The second electrode 30 is formed of AlSi, for example. The second electrode 30 may be formed of Al.

Next, a description will be made about a method of making the impurity concentration of the n-type diffusion layer 57 low compared to the n⁺ cathode layer 67. In the back surface of the substrate 10, ion injection is performed for the high resistance region 50 and the diode region 60, and ion injection is thereafter again performed only for the diode region 60.

Further, fine slits may be formed in portions of a mask for photoengraving, the portions corresponding to the high resistance region 50. An amount of ions to be injected is restricted by the slits, and the impurity concentration of the n-type diffusion layer 57 can be made low compared to the n⁺ cathode layer 67. In this method, diffusion layers at different concentrations can be formed by one action of photoengraving. Consequently, a rise of manufacturing cost due to addition of photoengraving procedures can be prevented.

The impurity concentrations in the layers are $10^{13}$ ions/cm² or higher for n⁺ and p⁺, $10^{13}$ to $10^{11}$ ions/cm² for n and p, and $10^{11}$ ions/cm² or lower for n⁻ and p⁻. Further, the concentration in the n⁺ cathode layer 67 is set very high compared to the concentration in the p collector layer 47. This enables an ohmic contact between AlSi with a large work function and the n⁺ cathode layer 67.

Figure 2:
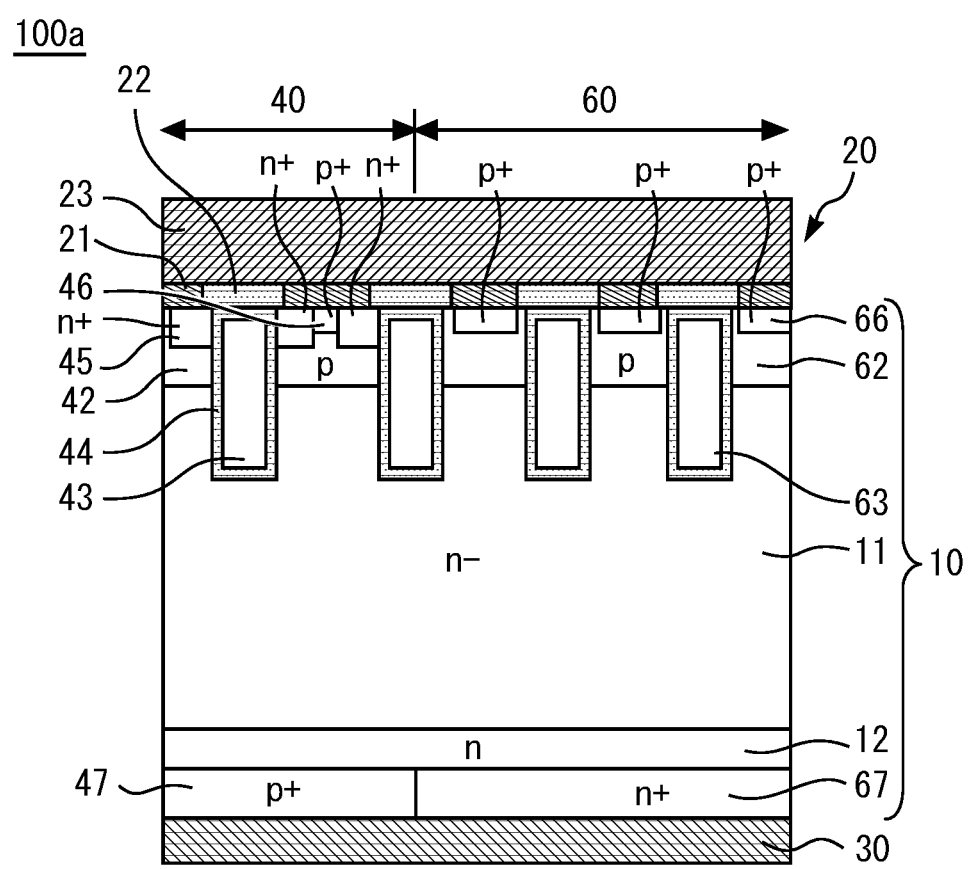
FIG. 2 is a cross-sectional view of a semiconductor device according to a comparative example.

FIG. 2 is a cross-sectional view of a semiconductor device 100a according to a comparative example. The semiconductor device 100a is different from the semiconductor device 100 in the point that the high resistance region 50 is not provided. A boundary between the p collector layer 47 and the n⁺ cathode layer 67 in the back surface of the substrate 10 agrees with a boundary between the IGBT region 40 and the diode region 60.

Figure 3:
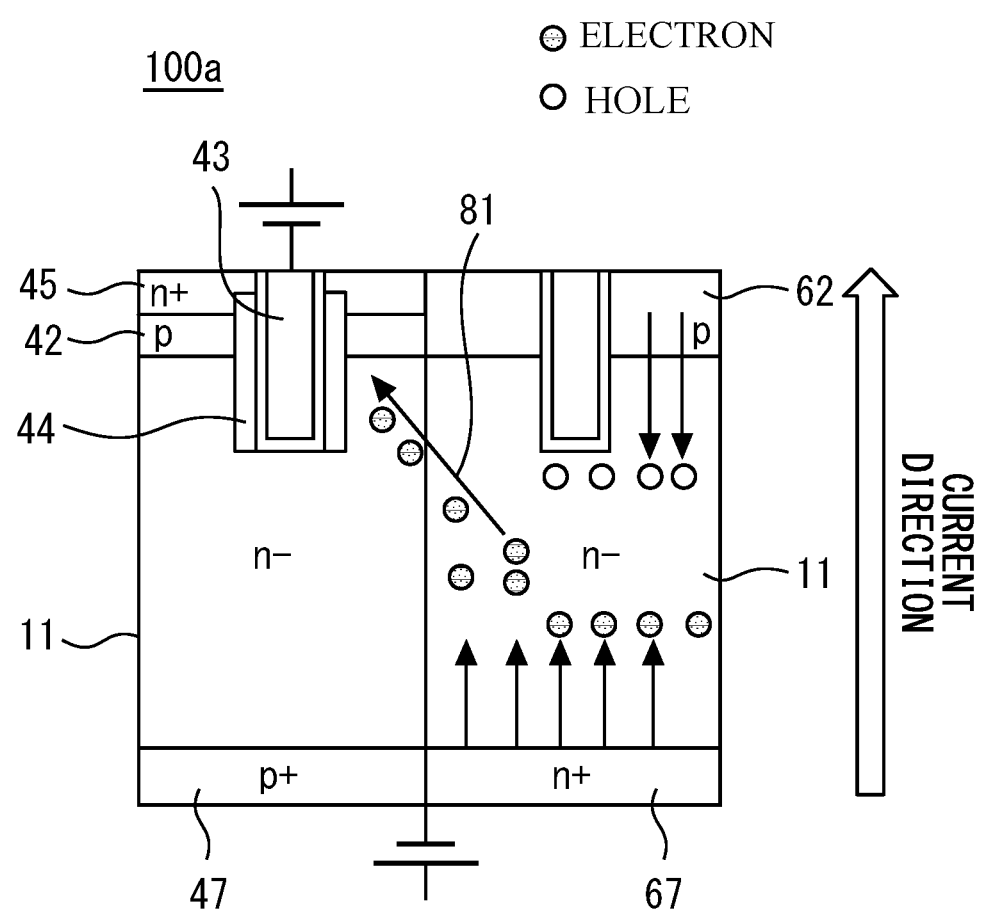
FIG. 3 is a diagram explaining snapback.

FIG. 3 is a diagram explaining snapback. In FIG. 3, for convenience, a structure of the semiconductor device 100a is simplified. In a case where the distance between the n⁺ cathode layer 67 and a gate inversion layer is short when a diode operates, as indicated by an arrow 81, electrons from the n⁺ cathode layer 67 flow to the emitter electrode, and snapback occurs. Consequently, a forward voltage drop of the diode becomes large, and loss in the semiconductor device 100a may increase.

However, in this embodiment, the impurity concentration of the n-type diffusion layer 57 is low compared to the n⁺ cathode layer 67. Thus, a contact resistance between the n-type diffusion layer 57 and the second electrode 30 is higher than a contact resistance between the n⁺ cathode layer 67 and the second electrode 30. Further, the contact resistance between the n-type diffusion layer 57 and the second electrode 30 is higher than a contact resistance between the p collector layer 47 and the second electrode 30. In this case, the high resistance region 50 does not contribute to an operation of either one of the IGBT and the diode. In other words, a non-energized region through which no current flows is formed between the IGBT region 40 and the diode region 60.

In this embodiment, a long distance between the n⁺ cathode layer 67 and the gate inversion layer can be secured by the high resistance region 50. Consequently, electrons can be inhibited from flowing from the n⁺ cathode layer 67 to the emitter electrode when the diode is energized. Similarly, electrons can be inhibited from flowing from the emitter electrode to the n⁺ cathode layer 67 when the IGBT is energized. Consequently, snapback can be prevented, and loss in the semiconductor device 100 can be reduced.

Further, the width of the high resistance region 50 is equal to or greater than the thickness of the substrate 10. As the width of the high resistance region 50 becomes wider, it becomes easier to inhibit electrons from flowing from the n⁺ cathode layer 67 to the emitter electrode when the diode is energized. In particular, it has been observed in an experiment that in a case where the width of the high resistance region 50 is equal to or greater than a wafer thickness, snapback can certainly be prevented. Here, the width of the high resistance region 50 is equal to the width of the n-type diffusion layer 57.

Figure 4:
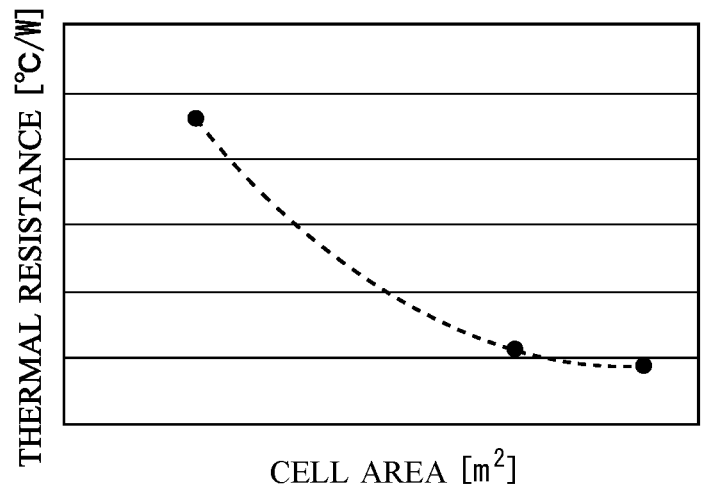
FIG. 4 is a diagram illustrating the relationship between a cell area and a thermal resistance in a case where the IGBT and the diode are separately provided.

FIG. 4 is a diagram illustrating the relationship between a cell area and a thermal resistance in a case where the IGBT and the diode are separately provided. In a case where the IGBT and the diode are provided as separate chips, the thermal resistance of the chip is in general determined by the chip area and thickness. The thermal resistance becomes lower as the cell area as the chip area becomes larger. Consequently, in order to improve the thermal resistance, necessity of expanding the chip area may occur. Thus, size reduction, weight reduction, and cost reduction of an inverter device including an IGBT may be hindered.

On the other hand, in an RC-IGBT, an IGBT cell and a diode cell are formed on the same semiconductor substrate. Thus, the diode cell can contribute to heat dissipation when the IGBT cell operates, and the IGBT cell can contribute to heat dissipation when the diode cell operates. Consequently, the thermal resistance can be improved better than a case where the IGBT and the diode are separately provided.

However, in a continuous operation such as an inverter operation, an operation of the diode may start before heat generated in an operation of the IGBT is completely dissipated. In this case, thermal interference occurs between the IGBT and the diode. Thus, the thermal resistance possibly becomes higher than in steady energization.

Figure 5:
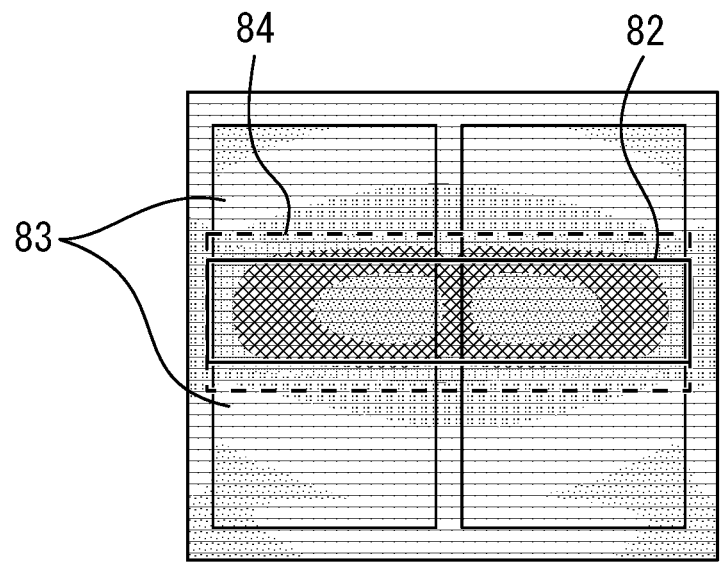
FIG. 5 is a diagram explaining spread of heat in the RC-IGBT.

FIG. 5 is a diagram explaining spread of heat in the RC-IGBT. FIG. 5 illustrates a simulation result of steady heat of the RC-IGBT. A heat generating region 82 indicates a block in which an operating device is formed. A non-heat-generating region 83 indicates a block in which a device not operating is formed. A region 84 indicated by the broken-line frame indicates a region in which heat from the heat generating region 82 as a heat generating source spreads. In FIG. 5, the region 84 in which heat spreads is larger than the heat generating region 82 as the heat generating source.

However, in this embodiment, the high resistance region 50 in which a current hardly flows is provided between the IGBT region 40 and the diode region 60. In other words, in the semiconductor device 100, a region can be formed which contributes only to heat dissipation without generating heat. Accordingly, the IGBT region 40 and the diode region 60 become less likely to be subject to thermal interference in a continuous operation. Consequently, the thermal resistance can be reduced, and heat dissipation can be enhanced.

An influence of heat is reduced more as the distance from a heat generating portion becomes longer. In this embodiment, the width of the high resistance region 50 is made equal to or greater than the thickness of the substrate 10, and mutual heat influences can thereby be reduced in the IGBT region 40 and the diode region 60.

As described above, in this embodiment, while a defect such as snapback occurring in a boundary region between the IGBT and the diode is inhibited, the thermal resistance can be reduced. Here, an active region of the whole semiconductor device 100 is decreased due to provision of the high resistance region 50. However, the above effect can reduce loss in the whole semiconductor device 100.

Further, in general, when a p layer with a high impurity concentration contacts with the diode region, holes may excessively flow into the p layer in a recovery operation. This possibly causes recovery destruction. In contrast, in this embodiment, the impurity concentration and thickness are equal between the p anode diffusion layer 62 and the p-type diffusion layer 52. Consequently, recovery destruction can be prevented.

The semiconductor device 100 of this embodiment is used as a power device as a power semiconductor device, for example. The semiconductor device 100 may be used in a field of home appliances, electric automobiles, or railways or a field of renewable energy such as solar photovoltaics or wind power generation, for example. An inverter circuit is constructed by using the semiconductor device 100, and an inductive load such as an induction motor may thereby be driven. In a case where the inverter circuit is formed with the semiconductor device 100, the diode region 60 functions as a freewheeling diode for refluxing a current generated by a counter electromotive force of the inductive load.

Figure 6:
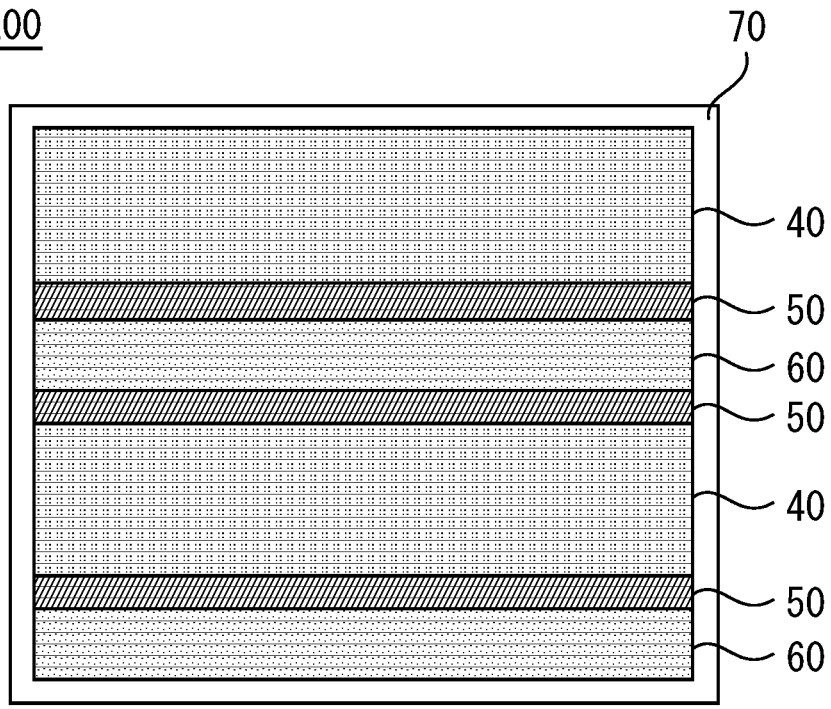
FIG. 6 is a plan view of a semiconductor device according to a first modification example of the first embodiment.

FIG. 6 is a plan view of a semiconductor device 200 according to a first modification example of the first embodiment. As in the semiconductor device 200, a stripe structure may be formed in which the IGBT regions 40 and the diode regions 60 are alternately arranged. The high resistance region 50 is arranged between the IGBT region 40 and the diode region 60 neighboring each other. Further, a termination region 70 is provided around a region in which the IGBT regions 40, the high resistance regions 50, and the diode regions 60 are formed.

Figure 7:
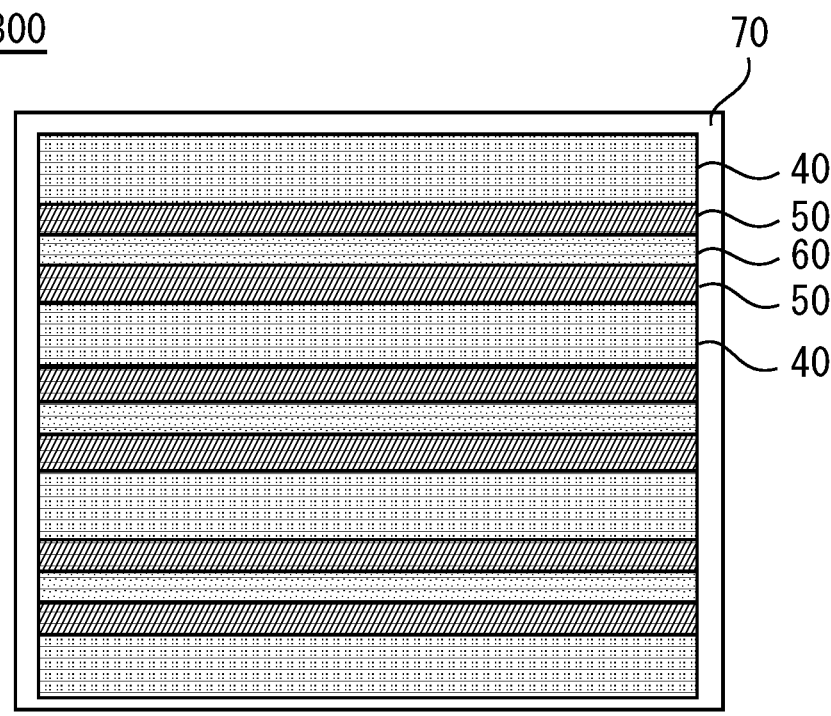
FIG. 7 is a plan view of a semiconductor device according to a second modification example of the first embodiment.
Figure 8:
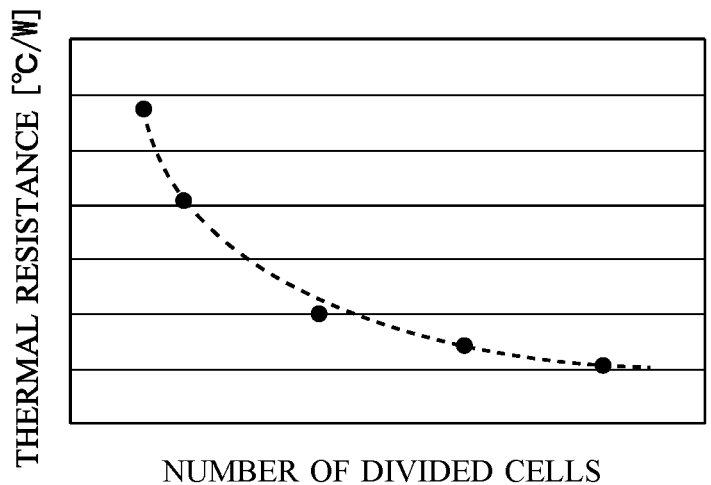
FIG. 8 is a diagram illustrating the relationship between the number of divided cells and the thermal resistance.

FIG. 7 is a plan view of a semiconductor device 300 according to a second modification example of the first embodiment. In the semiconductor device 300, the widths of the IGBT region 40 and the diode region 60 are narrow compared to the semiconductor device 200. The semiconductor device 300 has a greater number of divided cells than the semiconductor device 200. FIG. 8 is a diagram illustrating the relationship between the number of divided cells and the thermal resistance. The thermal resistance can be reduced by increasing the number of divided cells. The numbers of IGBT regions 40, high resistance regions 50, and diode regions 60 which are included in the semiconductor device 300 are not limited to those illustrated in FIG. 7.

Figure 9:
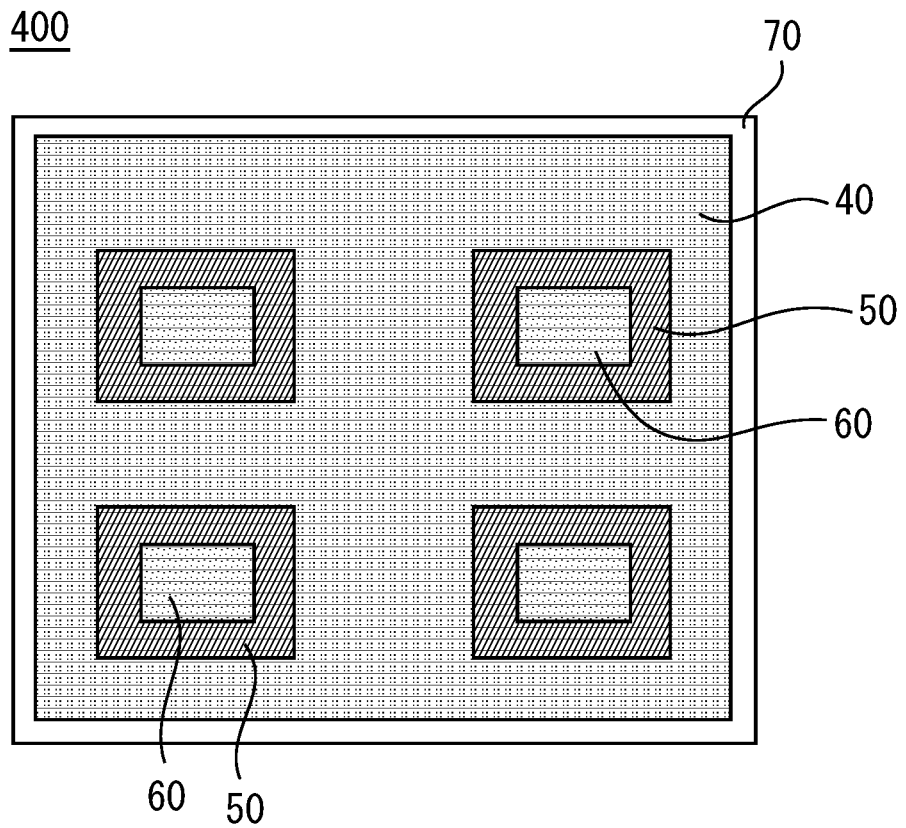
FIG. 9 is a plan view of a semiconductor device according to a third modification example of the first embodiment.

FIG. 9 is a plan view of a semiconductor device 400 according to a third modification example of the first embodiment. In the semiconductor device 400, the high resistance region 50 surrounds the diode region 60, and the IGBT region 40 surrounds the high resistance region 50. As a layout of the IGBT region 40, the high resistance region 50, and the diode region 60, any layout may be employed in which the high resistance region 50 is arranged between the IGBT region 40 and the diode region 60. Further, in accordance with needed heat dissipation or the like, the width of the high resistance region 50 may be made narrower than the thickness of the substrate 10.

These modifications can be applied, as appropriate, to semiconductor devices according to the following embodiments. Note that the semiconductor devices according to the following embodiments are similar to those of the first embodiment in many respects, and thus differences between the semiconductor devices according to the following embodiments and those of the first embodiment will be mainly described below.

Second Embodiment

Figure 10:
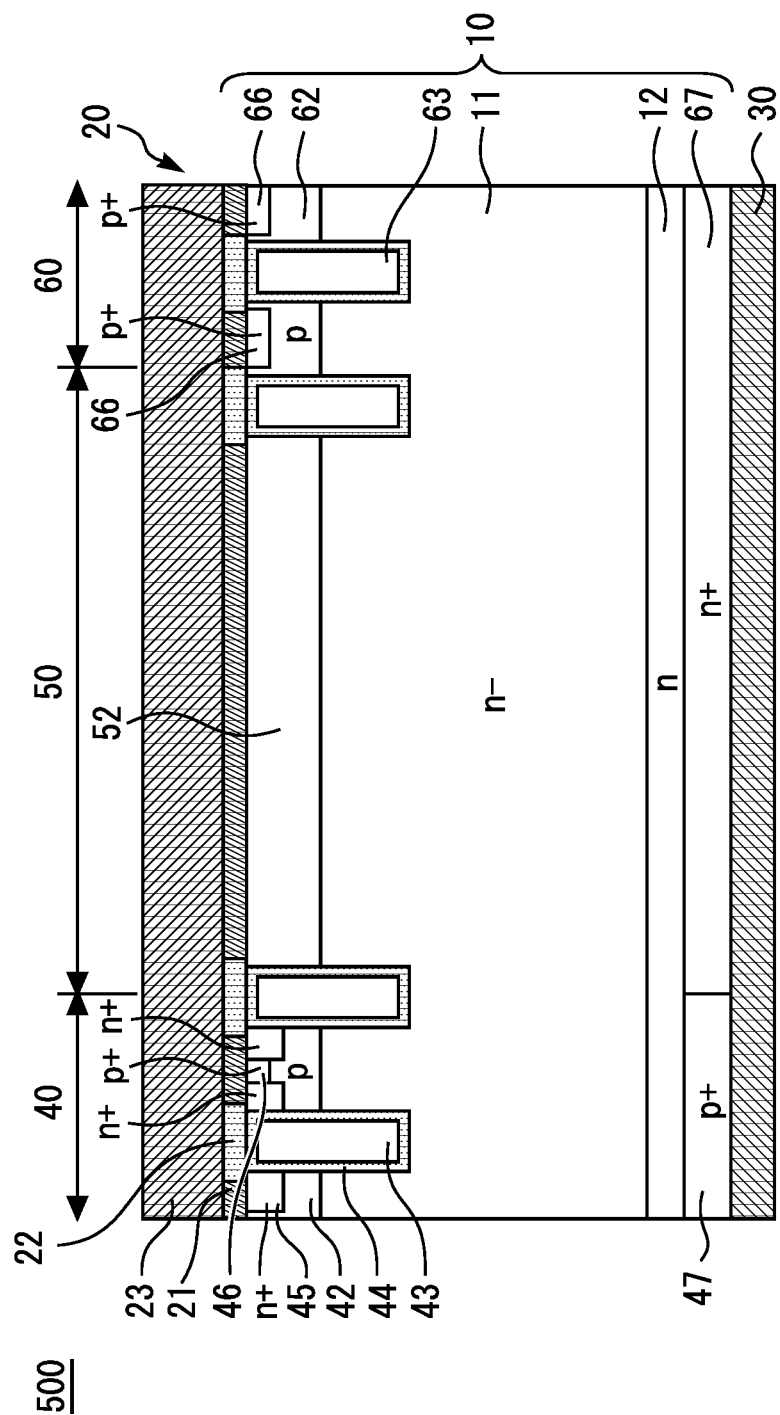
FIG. 10 is a cross-sectional view of a semiconductor device according to a second embodiment.

FIG. 10 is a cross-sectional view of a semiconductor device 500 according to a second embodiment. In this embodiment, a structure of the high resistance region 50 is different from the first embodiment. The n-type diffusion layer 57 is not formed in the semiconductor device 500. On the back surface side of the substrate 10, the $n^+$ cathode layer 67 is provided in the diode region 60 and the high resistance region 50.

The impurity concentration and thickness are equal among the p base diffusion layer 42, the p-type diffusion layer 52, and the p anode diffusion layer 62. The substrate 10 has the $p^+$ contact diffusion layers 46 and 66 between the p base diffusion layer 42 and the barrier metal 21 and between the p anode diffusion layer 62 and the barrier metal 21. The impurity concentrations of the $p^+$ contact diffusion layers 46 and 66 are higher than the impurity concentrations of the p base diffusion layer 42, the p-type diffusion layer 52, and the p anode diffusion layer 62. The $p^+$ contact diffusion layers 46 and 66 contact with the barrier metal 21. Further, the high resistance region 50 does not have the $p^+$ contact diffusion layer 46 or 66. Consequently, in the high resistance region 50, the impurity concentration of a portion contacting with the barrier metal 21 is lower than the impurity concentrations of the $p^+$ contact diffusion layers 46 and 66.

The $p^+$ contact diffusion layers 46 and 66 are layers for reducing contact resistances. The $p^+$ contact diffusion layers 46 and 66 with high concentrations are formed, and an ohmic contact can thereby be formed between the substrate 10 and Ti with a small work function.

In this embodiment, the $p^+$ contact diffusion layers 46 and 66 are selectively arranged. Thus, the impurity concentration of the portion of the substrate 10, the portion contacting with the barrier metal 21, is lower in the high resistance region 50 than in the IGBT region 40 and the diode region 60. Thus, in the high resistance region 50, an ohmic contact is not formed between the barrier metal 21 as a Ti electrode and the substrate 10. In other words, in the high resistance region 50, a contact resistance between the substrate 10 and the barrier metal 21 is higher than in the IGBT region 40 and the diode region 60. Thus, the high resistance region 50 with a high contact resistance is formed. Consequently, in this embodiment also, effects of preventing snapback and reducing the thermal resistance can be obtained.

Further, the width of the high resistance region 50 is equal to or greater than the thickness of the substrate 10. Here, the width of the high resistance region 50 corresponds to the width of a region interposed between the boundary between the p collector layer 47 and the $n^+$ cathode layer 67 and the $p^+$ contact diffusion layer 66 of the diode region 60. Accordingly, the effects of preventing snapback and reducing the thermal resistance can further be improved.

Third Embodiment

Figure 11:
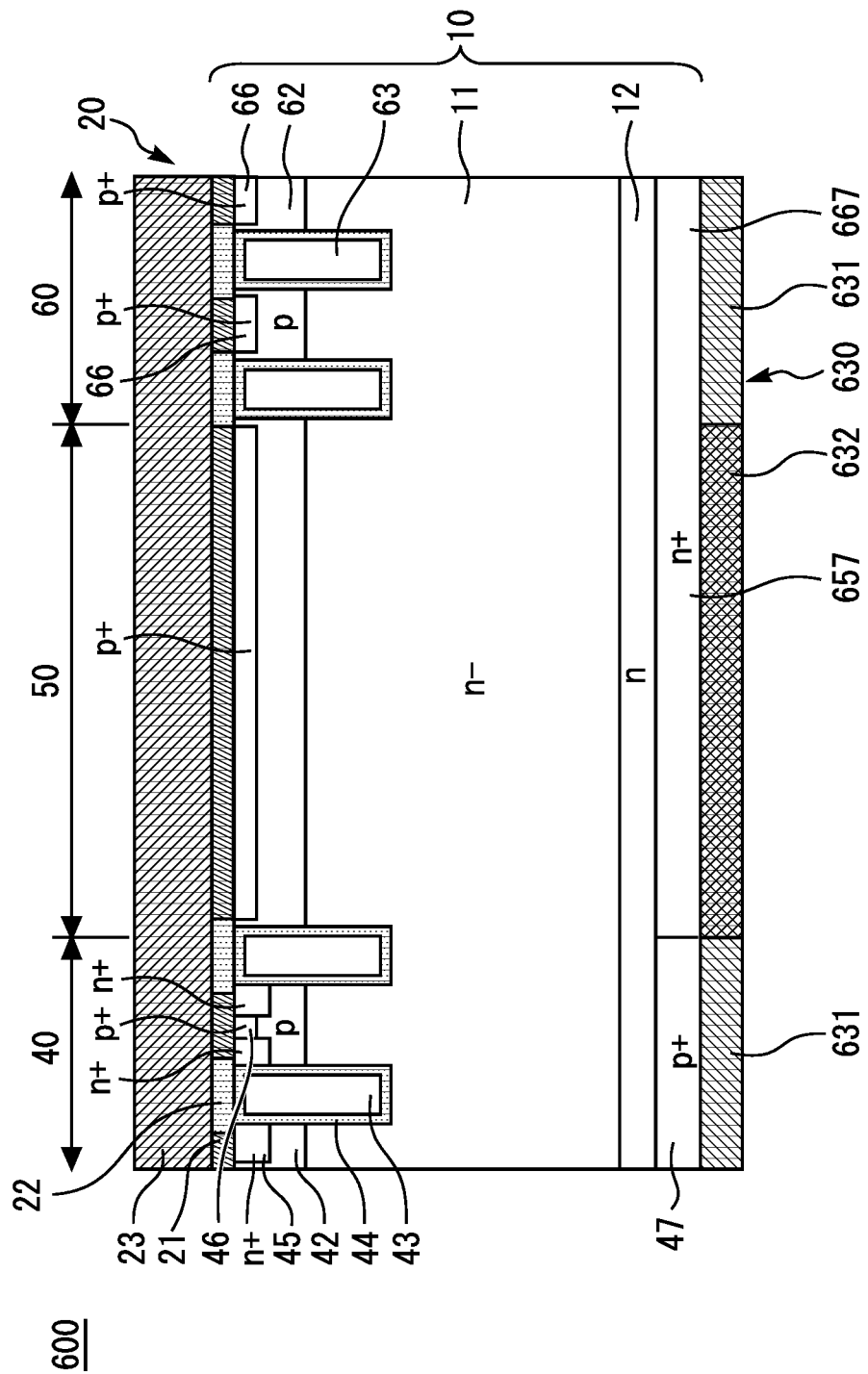
FIG. 11 is a cross-sectional view of a semiconductor device according to a third embodiment.

FIG. 11 is a cross-sectional view of a semiconductor device 600 according to a third embodiment. In the semiconductor device 600, a structure of the back surface side of the substrate 10 and a structure of a second electrode 630 are different from the first embodiment. In the diode region 60, the substrate 10 has an $n^+$ cathode layer 667 on the back surface side. In the high resistance region 50, the substrate 10 has an n-type diffusion layer 657 on the back surface side. The impurity concentration and thickness of the n-type diffusion layer 657 are equal to those of the $n^+$ cathode layer 667.

The impurity concentration of the n-type diffusion layer 657 and the $n^+$ cathode layer 667 is $10^{13}$ to $10^{14}$ ions/cm$^2$. The impurity concentration of the n-type diffusion layer 657 and the $n^+$ cathode layer 667 is lower than the impurity concentration of the $n^+$ cathode layer 67 of the first embodiment.

In the second electrode 630, an electrode 631 contacting with the p collector layer 47 and the $n^+$ cathode layer 667, and the electrode 632 contacting with the n-type diffusion layer 657 are formed of different materials. The electrode 631 contacting with the p collector layer 47 and the $n^+$ cathode layer 667 is formed of NiSi. The electrode 632 contacting with the n-type diffusion layer 657 is formed of AlSi. The electrode 632 may be formed of Al.

In general, NiSi can contact with an n layer with a low concentration at a low resistance. The impurity concentration of the $n^+$ cathode layer 667 is set lower than the impurity concentration of a common structure, and a contact at a low resistance can thereby be formed between the p collector layer 47 and the $n^+$ cathode layer 667 and the second electrode 630. The impurity concentration of the $n^+$ cathode layer 667 is higher than that of the n buffer layer 12 and lower than that of the $n^+$ emitter diffusion layer 45, for example.

The electrode 632 of the high resistance region 50 is formed of AlSi. In general, a contact resistance between AlSi and the n layer with a low concentration is high. Thus, a contact resistance between the n-type diffusion layer 657 and the electrode 632 is high. Consequently, a contact resistance between the n-type diffusion layer 657 and the second electrode 630 is higher than a contact resistance between the $n^+$ cathode layer 667 and the second electrode 630. Further, the contact resistance between the n-type diffusion layer 657 and the second electrode 630 is higher than a contact resistance between the p collector layer 47 and the second electrode 630. Thus, the high resistance region 50 with a high contact resistance is formed. Consequently, in this embodiment also, the effects of preventing snapback and reducing the thermal resistance can be obtained.

Further, the width of the high resistance region 50 may be equal to or greater than the thickness of the substrate 10. Here, the width of the high resistance region 50 corresponds to the width of the electrode 632. Accordingly, the effects of preventing snapback and reducing the thermal resistance can further be improved.

Fourth Embodiment

Figure 12:
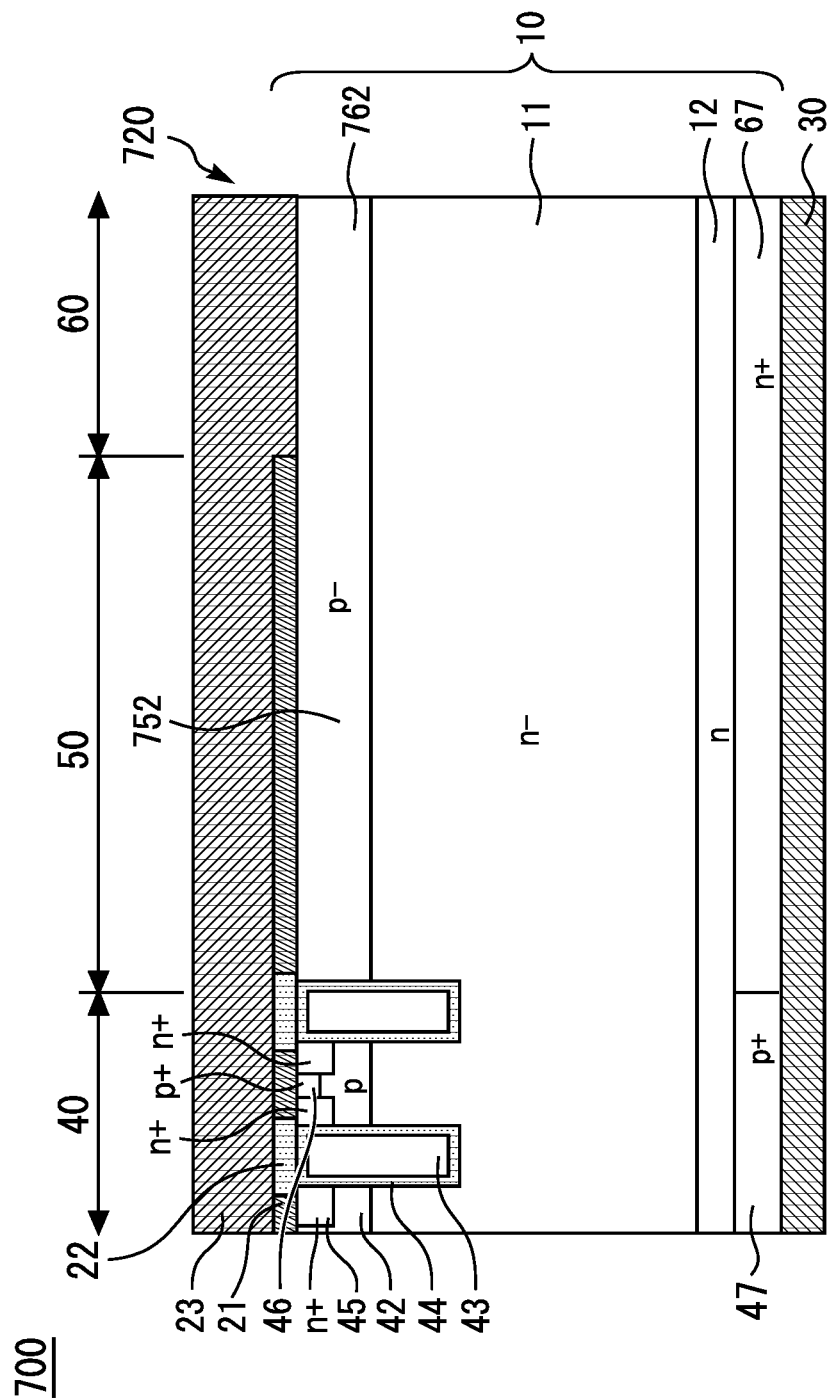
FIG. 12 is a cross-sectional view of a semiconductor device according to a fourth embodiment.

FIG. 12 is a cross-sectional view of a semiconductor device 700 according to a fourth embodiment. In the semiconductor device 700, the structure of the upper surface side of the substrate 10 and a structure of a first electrode 720 are different from the second embodiment. In the IGBT region 40, the substrate 10 has the p base diffusion layer 42 on the upper surface side. In the diode region 60, the substrate 10 has a p anode diffusion layer 762 on the upper surface side. In the high resistance region 50, the substrate 10 has a p-type diffusion layer 752 on the upper surface side. The impurity concentrations of the p anode diffusion layer 762 and the p-type diffusion layer 752 are lower than the impurity concentration of the p base diffusion layer 42.

The first electrode 720 has the barrier metal 21 contacting with the upper surface of the substrate 10 in the IGBT region 40 and the high resistance region 50. Further, the first electrode 720 has the top electrode 23 provided on the barrier metal 21. The top electrode 23 contacts with the upper surface of the substrate 10 in the diode region 60.

In general, when barrier metal formed of Ti or the like is caused to contact with a p⁻ layer with a low concentration, a contact resistance increases. Thus, in this embodiment, a contact resistance between the p-type diffusion layer 752 and the barrier metal 21 becomes high. Meanwhile, the barrier metal 21 is not provided immediately above the p anode diffusion layer 762. The p anode diffusion layer 762 contacts with the top electrode 23 as an anode electrode formed of AlSi. Consequently, an increase in a contact resistance in the diode region 60 can be prevented.

From the above, in this embodiment, the contact resistance between the p-type diffusion layer 752 and the barrier metal 21 is higher than a contact resistance between the p anode diffusion layer 762 and the top electrode 23. Thus, the high resistance region 50 with a high contact resistance is formed. In this embodiment, a contact resistance between the upper surface of the substrate 10 and the first electrode 20 is higher in the high resistance region 50 than in the IGBT region 40 and the diode region 60. Thus, the effects of preventing snapback and reducing the thermal resistance can be obtained.

Further, the width of the high resistance region 50 may be equal to or greater than the thickness of the substrate 10. Here, the width of the high resistance region 50 corresponds to the width of a region interposed between the boundary between the p collector layer 47 and the n⁺ cathode layer 67 and an end portion of the barrier metal 21 on the diode region 60 side. Accordingly, the effects of preventing snapback and reducing the thermal resistance can further be improved.

However, in this embodiment, the impurity concentration of the p anode diffusion layer 762 is low. Thus, a recovery current can be reduced. Consequently, recovery destruction can be prevented.

Note that the technical features described in the embodiments may be used in appropriate combinations. For example, the first and second embodiments may be combined together, or the third and fourth embodiments may be combined together.

REFERENCE SIGNS LIST

100, 200, 300, 400, 500, 600, 700 semiconductor device, 10 substrate, 20, 720 first electrode, 21 barrier metal, 23 top electrode, 30, 630 second electrode, 631, 632 electrode, 40 IGBT region, 42 p base diffusion layer, 50 high resistance region, 52, 752 p-type diffusion layer, 57, 657 n-type diffusion layer, 60 diode region, 62, 762 p anode diffusion layer, 67, 667 n⁺ cathode layer

The invention claimed is:

1. A semiconductor device comprising:
   a substrate having an IGBT region, a diode region, and a high resistance region between the IGBT region and the diode region;
   a first electrode provided on an upper surface of the substrate; and
   a second electrode provided on a back surface as a surface on an opposite side to the upper surface of the substrate, wherein
   in the high resistance region, a contact resistance between the upper surface of the substrate and the first electrode or a contact resistance between the back surface of the substrate and the second electrode is higher than in the diode region, and
   a width of the high resistance region is equal to or greater than a thickness of the substrate.

2. The semiconductor device according to claim 1, wherein
   in the diode region, the substrate has a cathode layer on the back surface side,
   in the high resistance region, the substrate has an n-type diffusion layer on the back surface side,
   an impurity concentration of the n-type diffusion layer is lower than an impurity concentration of the cathode layer, and
   a contact resistance between the n-type diffusion layer and the second electrode is higher than a contact resistance between the cathode layer and the second electrode.

3. The semiconductor device according to claim 1, wherein
   in the diode region, the substrate has a cathode layer on the back surface side,
   in the high resistance region, the substrate has, on the back surface side, an n-type diffusion layer whose impurity concentration is equal to an impurity concentration of the cathode layer,
   among portions of the second electrode, a portion contacting with the cathode layer and a portion contacting with the n-type diffusion layer are formed of different materials, and
   a contact resistance between the n-type diffusion layer and the second electrode is higher than a contact resistance between the cathode layer and the second electrode.

4. The semiconductor device according to claim 3, wherein
   among the portions of the second electrode, the portion contacting with the cathode layer is formed of NiSi, and
   among the portions of the second electrode, the portion contacting with the n-type diffusion layer is formed of AlSi.

5. The semiconductor device according to claim 1, wherein
the first electrode has barrier metal contacting with the upper surface of the substrate in the IGBT region, the diode region, and the high resistance region,
an impurity concentration of a portion of the substrate, the portion contacting with the barrier metal, is lower in the high resistance region than in the IGBT region and the diode region, and
in the high resistance region, a contact resistance between the substrate and the barrier metal is higher than in the diode region.

6. The semiconductor device according to claim 5, wherein
in the IGBT region, the substrate has a base layer on the upper surface side,
in the diode region, the substrate has an anode layer on the upper surface side,
in the high resistance region, the substrate has a p-type diffusion layer on the upper surface side,
an impurity concentration is equal among the base layer, the anode layer, and the p-type diffusion layer,
the substrate has contact layers whose impurity concentrations are higher than an impurity concentration of the anode layer and which contact with the barrier metal, the contact layers provided between the base layer and the barrier metal and between the anode layer and the barrier metal, and
in the high resistance region, the impurity concentration of the portion contacting with the barrier metal is lower than the impurity concentrations of the contact layers.

7. The semiconductor device according to claim 1, wherein
in the IGBT region, the substrate has a base layer on the upper surface side,
in the diode region, the substrate has an anode layer on the upper surface side,
in the high resistance region, the substrate has a p-type diffusion layer on the upper surface side,
impurity concentrations of the anode layer and the p-type diffusion layer are lower than an impurity concentration of the base layer,
the first electrode has barrier metal contacting with the upper surface of the substrate in the IGBT region and the high resistance region and a top electrode provided on the barrier metal and contacting with the upper surface of the substrate in the diode region, and
a contact resistance between the p-type diffusion layer and the barrier metal is higher than a contact resistance between the anode layer and the top electrode.

8. The semiconductor device according to claim 1, wherein
in the diode region, the substrate has an anode layer on the upper surface side,
in the high resistance region, the substrate has a p-type diffusion layer on the upper surface side, and
an impurity concentration and a thickness are equal between the anode layer and the p-type diffusion layer.

9. A semiconductor device comprising:
a substrate having an IGBT region, a diode region, and a high resistance region between the IGBT region and the diode region;
a first electrode provided on an upper surface of the substrate; and
a second electrode provided on a back surface as a surface on an opposite side to the upper surface of the substrate, wherein
in the diode region, the substrate has a cathode layer on the back surface side,
in the high resistance region, the substrate has, on the back surface side, an n-type diffusion layer whose impurity concentration is equal to an impurity concentration of the cathode layer,
among portions of the second electrode, a portion contacting with the cathode layer and a portion contacting with the n-type diffusion layer are formed of different materials, and
a contact resistance between the n-type diffusion layer and the second electrode is higher than a contact resistance between the cathode layer and the second electrode.

10. A semiconductor device comprising:
a substrate having an IGBT region, a diode region, and a high resistance region between the IGBT region and the diode region;
a first electrode provided on an upper surface of the substrate; and
a second electrode provided on a back surface as a surface on an opposite side to the upper surface of the substrate, wherein
in the IGBT region, the substrate has a base layer on the upper surface side,
in the diode region, the substrate has an anode layer on the upper surface side,
in the high resistance region, the substrate has a p-type diffusion layer on the upper surface side,
impurity concentrations of the anode layer and the p-type diffusion layer are lower than an impurity concentration of the base layer,
the first electrode has barrier metal contacting with the upper surface of the substrate in the IGBT region and the high resistance region and a top electrode provided on the barrier metal and contacting with the upper surface of the substrate in the diode region, and
a contact resistance between the p-type diffusion layer and the barrier metal is higher than a contact resistance between the anode layer and the top electrode.

* * * * *